United States Patent
Aoki et al.

(10) Patent No.: US 6,634,089 B1
(45) Date of Patent: Oct. 21, 2003

(54) METHOD FOR DISMANTLING A MAGNETIC FIELD GENERATOR

(75) Inventors: Masaaki Aoki, Takatsuki (JP); Shigeo Hashimoto, Saga (JP)

(73) Assignee: Sumitomo Special Metals Co. Ltd., Osaka (JP)

( * ) Notice: Subject to any disclaimer, the term of this patent is extended or adjusted under 35 U.S.C. 154(b) by 274 days.

(21) Appl. No.: 09/615,729

(22) Filed: Jul. 13, 2000

(30) Foreign Application Priority Data

Jul. 15, 1999 (JP) .......................................... 11-201291

(51) Int. Cl.$^7$ ................................................. H01F 7/06
(52) U.S. Cl. ......................... 29/607; 29/596; 29/602.1; 324/318; 335/296
(58) Field of Search ............................... 29/602.1, 606, 29/596, 592.1, 607, 603.02, 732; 324/318, 296, 319; 335/306, 296

(56) References Cited

U.S. PATENT DOCUMENTS

| 4,679,022 A | * | 7/1987 | Miyamoto et al. | .......... 335/269 |
| 4,900,374 A | | 2/1990 | Panchanathan | .............. 148/101 |
| 4,943,774 A | * | 7/1990 | Breneman et al. | .......... 324/318 |
| 5,631,616 A | * | 5/1997 | Ohta et al. | |
| 5,659,250 A | | 8/1997 | Domigan et al. | ........... 324/320 |
| 6,333,630 B1 | * | 12/2001 | Holsinger et al. | .......... 324/319 |
| 6,340,888 B1 | * | 1/2002 | Aoki et al. | ................. 324/319 |
| 2002/0056187 A1 | * | 5/2002 | Doi | ............................. 29/607 |

FOREIGN PATENT DOCUMENTS

| EP | 1069575 | * | 1/2001 |
| JP | 61140106 | | 6/1986 |
| JP | 3-20045 | | 3/1991 |

* cited by examiner

*Primary Examiner*—Carl J. Arbes
*Assistant Examiner*—Minh Trinh
(74) *Attorney, Agent, or Firm*—Armstrong, Westerman, Hattori, LLP.

(57) ABSTRACT

A method for dismantling a magnetic field generator, which includes the steps of providing a plate yoke, and a permanent magnet provided on the plate yoke and having a plurality of neodymium magnets bonded together by an adhesive for the magnetic field generator; heating the magnetic field generator at a temperature of 200° C.~1000° C.; and thereafter dismantling the magnetic field generator. The dismantling method further includes the step of providing a column yoke connected to the plate yoke for the magnetic field generator.

8 Claims, 7 Drawing Sheets

F I G. 4
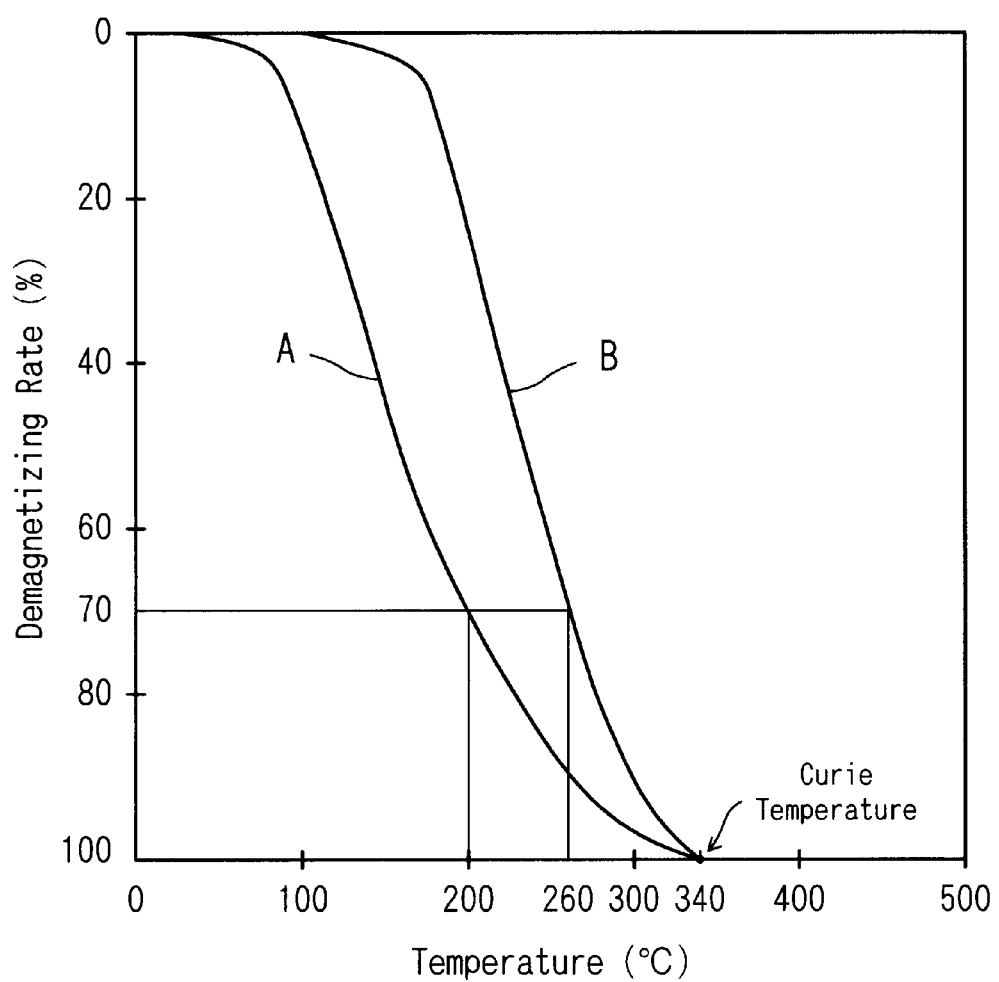

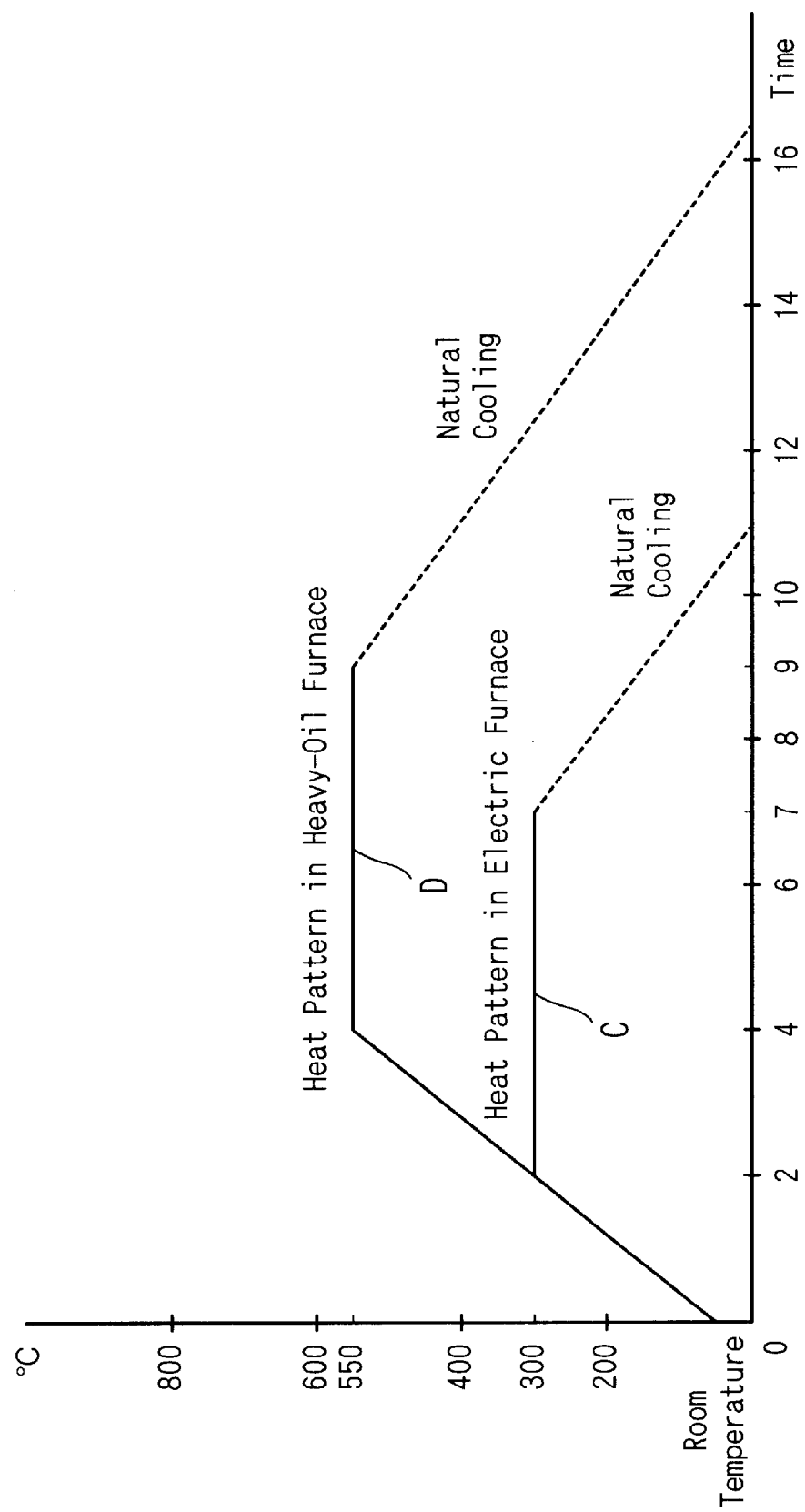

METHOD FOR DISMANTLING A MAGNETIC FIELD GENERATOR

BACKGROUND OF THE INVENTION

1. Field of the Invention

The present invention relates to a dismantling method and a recycling method for a magnetic field generator, and more specifically to a dismantling method and a recycling method for a magnetic field generator comprising neodymium magnets and used in a large MRI apparatus capable of scanning a human body.

2. Description of the Related Art

Size of the neodymium magnet, which is a sintered body, is limited. Usually therefore, in this kind of large magnetic field generator, a plurality of neodymium magnets are fixed to a plate yoke by an adhesive.

A method for dismantling such a magnetic field generator can be as follows: Specifically, screws connecting the plate yokes to column yokes are loosened, then the magnetic field generator is suspended by a crane, and disassembled. Each of the plate yokes is then bathed in a drum filled with solvent for melting the adhesive, and the neodymium magnets fixed to the plate yokes are taken out.

However, the neodymium magnets, as magnetized, have a very strong magnetism. Therefore, according to the above-mentioned method, it is dangerous because the neodymium magnets will be thrown out of the drum by strong repelling force among the neodymium magnets once the adhesive loses its adhering strength. Another potential danger is that a worker's hand can be caught between two neodymium magnets for example, by strong magnetic attraction, when one of the neodymium magnets is pulled off from another.

Further, the neodymium magnet is a sintered body which is fragile. Thus, once the adhesive loses its adhering strength, if the magnet is thrown by a magnetic repelling force acting among the neodymium magnets and hits something, the magnet will be chipped.

Further, if the neodymium magnet hits another neodymium magnet or the plate yoke, a spark will be generated, which may cause fire or explosion accident.

There may be an idea that the neodymium magnets are demagnetized by applying demagnetizing magnetic field at the time of dismantling the magnetic field generator. However, the magnetic field generator for MRI apparatus is large, and therefore demagnetizing operation, in which a strong and large magnetic field must be generated, is difficult. A large demagnetizing equipment is not realistic due to a high cost.

The Japanese Patent Publication (of examined Application for opposition) No. 3-20045 discloses a method, in which each of permanent magnets is first magnetized, then measured for its magnetic characteristic, then heated to demagnetize, and at a time of assembly, each of the magnets is re-magnetized in accordance with its magnetic characteristic for assembly into a magnet body. However, this method is for appropriately disposing the permanent magnets, and nothing has been disclosed for a method for dismantling or recycling the large magnetic field generator.

SUMMARY OF THE INVENTION

It is therefore a primary object of the present invention to provide a method for dismantling the magnetic field generator and a method of recycling the same, in which the dismantling and recycling can be made safely and at a low cost.

According to an aspect of the present invention, there is provided a dismantling method for a magnetic field generator comprising a plate yoke, and a permanent magnet provided on the plate yoke and including a plurality of neodymium magnets bonded together by an adhesive, wherein the magnetic field generator is heated at a temperature of 200° C.~1000° C.

If the heating temperature of the magnetic field generator is lower than 200° C., the neodymium magnets cannot be sufficiently demagnetized and cannot be taken out safely. Further, the adhesive has reversibility up to 200° C., and therefore if the heating temperature is lower than 200° C., then adhering strength will come back when the adhesive is cooled thereafter. On the other hand, if the heating temperature exceeds 1000° C., structure of the neodymium magnets is altered and its magnetic characteristic is deteriorated, making difficult to reuse the collected neodymium magnets. Therefore, by heating the magnetic field generator at a temperature of 200° C.~1000° C., the neodymium magnets are sufficiently demagnetized and the adhering strength of the adhesive is reduced. As a result, the neodymium magnets can be taken out safely, and the magnetic field generator can be dismantled safely. Further, the simple heating operation makes possible to reduce cost.

Preferably, the magnetic field generator further comprises a column yoke connected to the plate yoke. The as-magnetized neodymium magnets are very dangerous, but by heating the magnetic field generator in a state in which the column yoke is connected to the plate yoke, handling of the magnetic field generator at the time of dismantling becomes easier.

Further, preferably, the heating temperature of the magnetic field generator is 200° C.~400° C. Due to a characteristic of the neodymium magnets, aging becomes necessary if the heating temperature exceeds 400° C. Thus, by heating at a temperature not higher than 400° C., it becomes possible to reuse the neodymium magnets by only re-magnetizing the heated neodymium magnets without performing the aging operation.

Preferably, the heating temperature of the magnetic field generator is 200° C.~350° C., and at least one of the neodymium magnets is removed by first demagnetizing the neodymium magnet and then removing the adhesive. By heating at a temperature of 200° C.~350° C. as described above, the neodymium magnets are demagnetized, the adhesive is degraded, and the adhering strength of the adhesive is reduced. Thus, by only removing the degraded adhesive, the neodymium magnets can be taken out safely. Further, since surfaces of the neodymium magnets are not severely deteriorated, the neodymium magnets can be reused easily.

Further, preferably, the heating temperature of the magnetic field generator is 350° C.~1000° C., and at least one of the neodymium magnets is removed by carbonizing the adhesive. By heating the magnetic field generator at a temperature not lower than 350° C., the adhesive is carbonized to lose the adhering strength and the neodymium magnets lose the magnetism almost completely. Therefore, the removal and handling of the neodymium magnets becomes easy.

Still further, preferably, the adhesive is an acrylic adhesive. The acrylic adhesive has a high adhering strength under a room temperature, yet the adhering strength is reduced due to thermal degradation or carbonization if heated at a temperature exceeding 200° C. Therefore, the removal of the neodymium magnets becomes easy if the acrylic adhesive is used as the adhesive.

Preferably, the neodymium magnets are three-element neodymium magnets having a R—Fe—B (R is rare earth element) composition. The three-element neodymium magnet, as compared to a four-element neodymium magnet which includes Co, has a lower magnetic flux density and coercive force at a high temperature range, starts losing the magnetic force at a lower temperature, and has a greater demagnetizing rate. Therefore, if the three-element neodymium magnets are used, desired demagnetization can be achieved easily to the neodymium magnets, making the magnetic field generator suitable for recycling by heating.

Further, preferably, magnetic poles of the neodymium magnets are oriented in the same direction. If the magnetic poles of the neodymium magnets are oriented in the same direction, the magnetism generated becomes more intense. However, according to the present invention, the neodymium magnets can be collected safely even under such a situation.

According to another aspect of the present invention, there is provided a recycling method for a magnetic field generator comprising a plate yoke, and a permanent magnet provided on the plate yoke and including a plurality of neodymium magnets bonded together by an adhesive, wherein the magnetic field generator is heated to 200° C.~1000° C., then at least one of the neodymium magnets is removed, and a surface of the removed neodymium magnet is polished for reusing the neodymium magnet.

By polishing the surfaces of the removed neodymium magnets, the surfaces are cleaned and adhesion necessary for re-bonding the neodymium magnets are recovered, enabling the recycling of the neodymium magnets.

According to still another aspect of the present invention, there is provided a recycling method for a magnetic field generator comprising a plate yoke, and a permanent magnet provided on the plate yoke and including a plurality of neodymium magnets bonded together by an adhesive, wherein the magnetic field generator is heated to 200° C.~1000° C., then at least one of the neodymium magnets is removed, and the removed neodymium magnet is re-aged for reusing.

By re-aging the removed neodymium magnets, the characteristic of the neodymium magnets can be reliably reestablished, enabling smooth recycling of the neodymium magnets.

The object described above, other objects, features, aspects and advantages of the present invention will become clearer from the following description of embodiments to be presented with reference to the accompanying drawings.

BRIEF DESCRIPTION OF THE DRAWINGS

FIG. 4 is a graph showing a thermal demagnetization curve of a neodymium magnet;

FIG. 7 is a graph showing heat pattern examples at a time of heating the magnetic field generator.

DETAILED DESCRIPTION OF THE PREFERRED EMBODIMENTS

Now, embodiments of this invention will be described with reference to the accompanying drawings.

Figure 1:
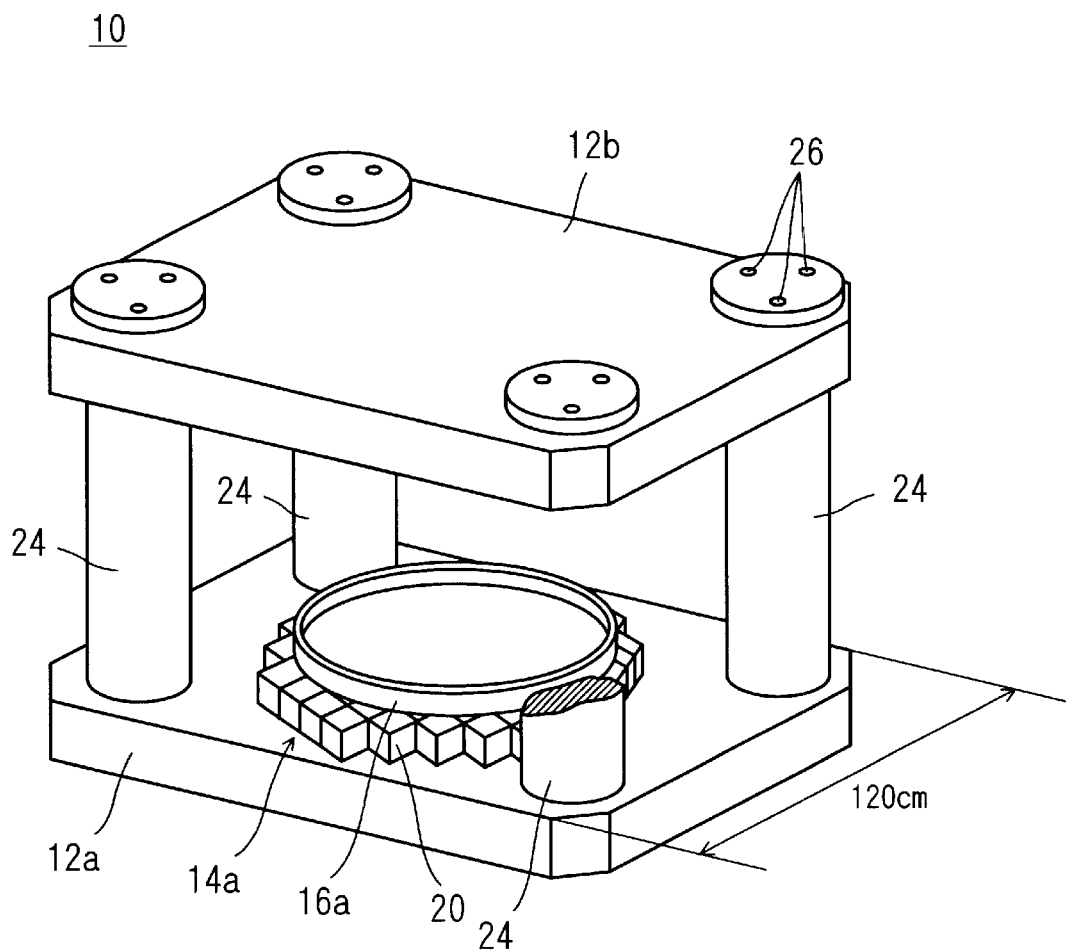
FIG. 1 is a perspective view, with partial elimination, showing a magnetic field generator to which the present invention is applied.
Figure 2:
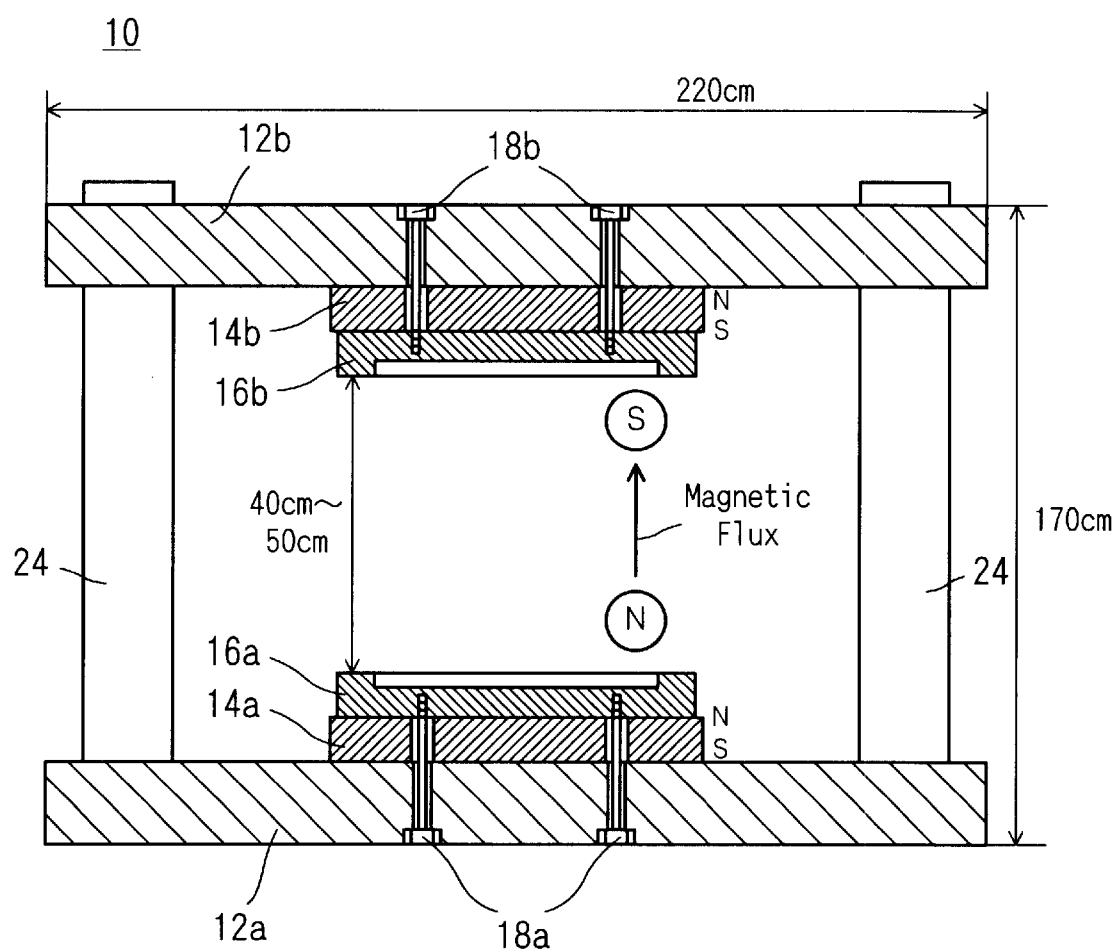
FIG. 2 is a sectional view showing a magnetic field generator.

FIG. 1 and FIG. 2 show an example of a magnetic field generator 10 to which the present invention is applied. The magnetic field generator 10 is a magnetic field generator for an MRI apparatus, and is now shown without electric components, being primarily made of magnetic components only. The magnetic field generator 10 comprises a pair of plate yokes 12a, 12b opposed to each other with a space in between. Each of the plate yokes 12a, 12b has a surface opposed to that of the other plate yoke. The surfaces are provided with permanent magnets 14a, 14b respectively, and pole pieces 16a, 16b disposed thereon respectively. Pole pieces 16a, 16b are fixed onto the permanent magnets 14a, 14b by a plurality of pole piece fixing bolts 18a, 18b penetrating the plate yokes 12a, 12b respectively.

Figure 3:
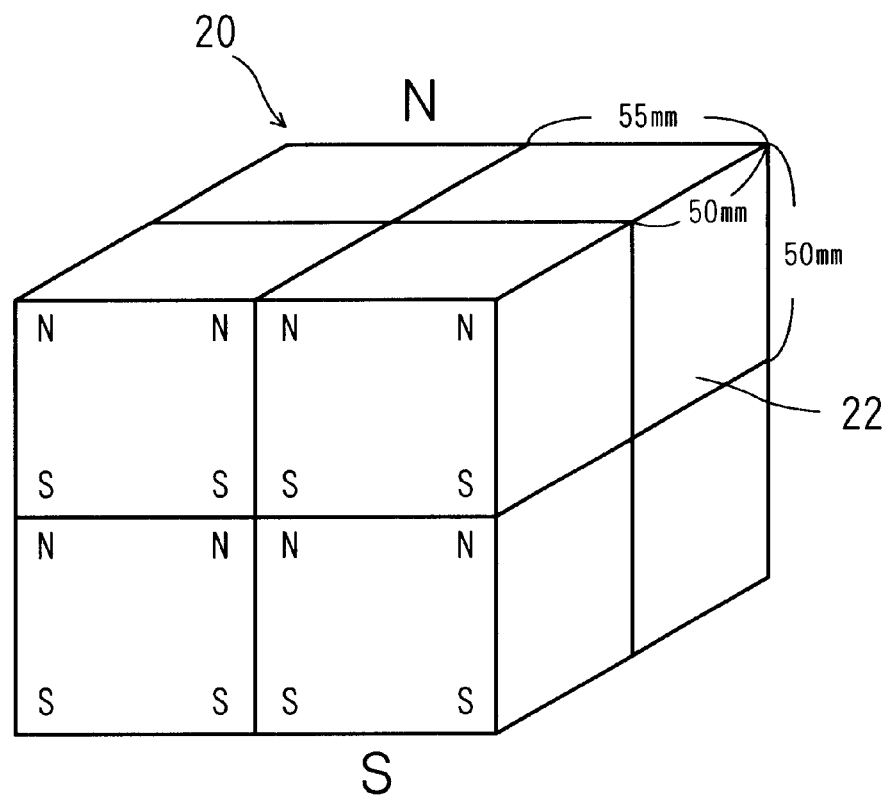
FIG. 3 is a perspective view showing a magnet block.

Each of the permanent magnets 14a, 14b is made of a plurality of magnet blocks 20. As shown in FIG. 3, the magnetic block 20 is formed by a plurality of neodymium magnets 22, each being a rectangular parallelepiped of a size 55 mm×50 mm×50 mm for example, bonded into a rectangular parallelepiped with magnetic poles oriented in the same direction. By using the neodymium magnets 22 of a size which can be uniformly sintered, the permanent magnets 14a, 14b having a consistent magnetic characteristic can be obtained. Further, by bonding each of the neodymium magnets 22 with its magnetic poles oriented in the same direction, an intense magnetic field of 0.2 T~0.3 T can be obtained between the pole pieces 16a, 16b.

As understood from FIG. 3, the neodymium magnets 22 are pulling each other in the vertical directions, but repelling against each other in the horizontal directions because faces of a same pole come side by side.

The neodymium magnet 22 is, for example, a three-element neodymium magnet having an R—Fe—B composition (31 wt % of Nd, 1.0 wt % of B, with the rest being Fe including such elements by an amount not greater than 0.3 wt % as Al, Cu and others) disclosed in the U.S. Pat. No. 4,770,723. A thermal demagnetizing curve of this three-element neodymium magnet is shown as curve A in FIG. 4. Further, a thermal demagnetizing curve of a four-element neodymium magnet further including 0.9 wt % of Co is shown as curve B.

As will be understood from comparison between the two curves A and B, the three-element neodymium magnet has a lower heat resistance than the four-element neodymium magnet, beginning to lose magnetism at a lower temperature and having a higher demagnetizing rate. Therefore, use of the three-element neodymium magnets makes easy to achieve desired demagnetization to the neodymium magnet 22. For example, if the three-element neodymium magnet is heated to 200° C., then demagnetizing rate will be 70%.

Returning to FIG. 2, each of the magnet blocks 20 of the permanent magnet 14a is disposed in tight contact with adjacent ones, with a specific magnetic pole (the north pole for example) oriented upward. On the other hand, each of the magnet blocks 20 of the permanent magnet 14b is disposed in tight contact with adjacent ones, with the other magnetic pole (the south pole in this example) oriented downward. In this way, the permanent magnet 14a and the permanent magnet 14b are faced with each other, with different magnetic-pole surfaces opposed to each other, and thus a uniform magnetic field is formed. It should be noted here that in each of the permanent magnet 14a, 14b, the magnet blocks 20 are bonded side by side by the adhesive.

Figure 5:
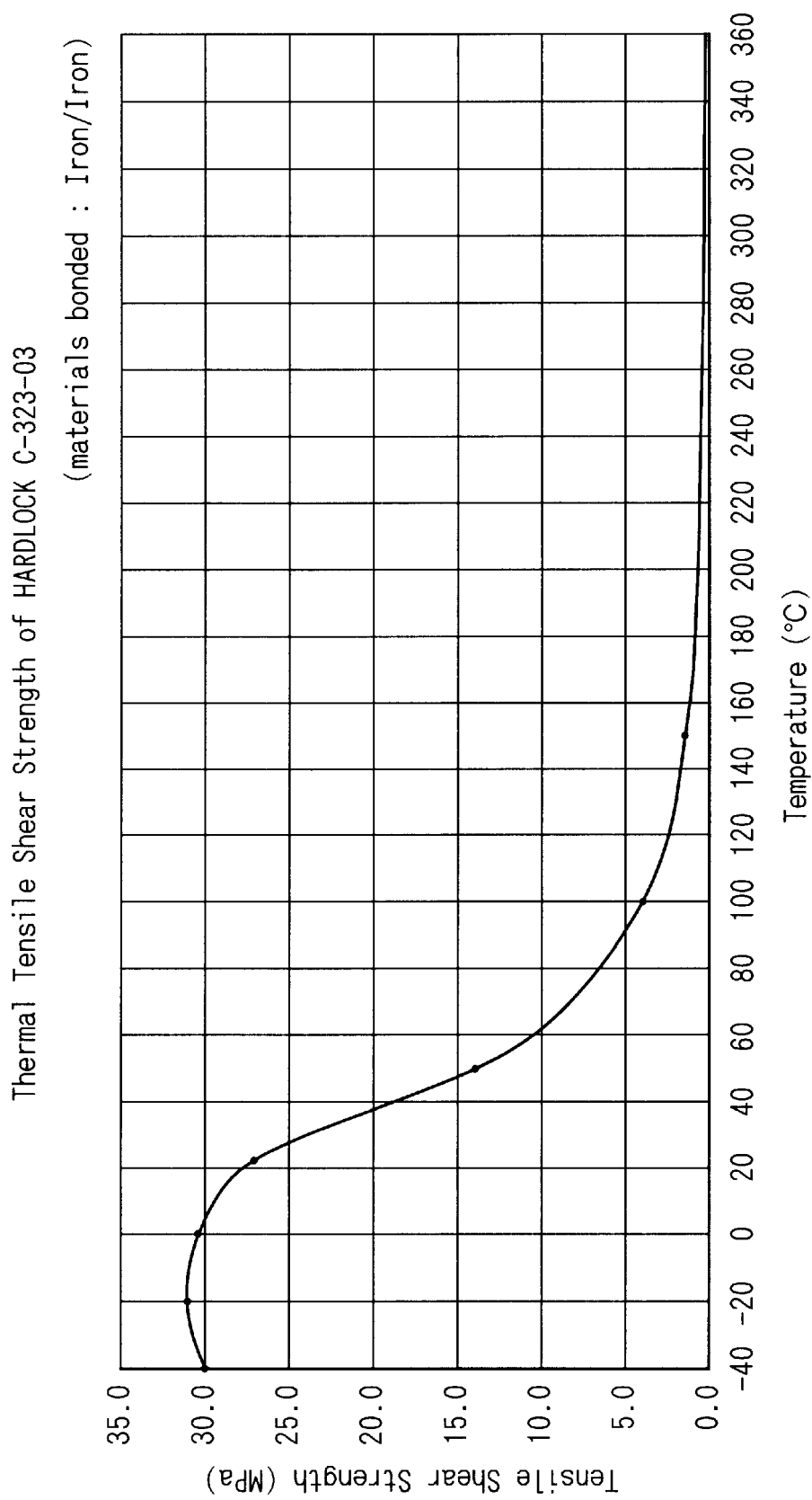
FIG. 5 is a graph showing thermal tensile shear strength of an adhesive.

The adhesive for the mutual bonding between the neodymium magnets 22 and between the magnet blocks 20 is an acrylic adhesive. An epoxy adhesive for example has to be heated for hardening quickly. However, the acrylic adhesive hardens quickly at a room temperature, and is suited for bonding the neodymium magnets 22. Therefore, by using the acrylic adhesive, the neodymium magnets 22 having a strong magnetic force and repelling against each other can easily be fixed onto the plate yokes 12a, 12b. On the other hand, adhering strength of the acrylic adhesive is decreased when heated. The acrylic adhesive undergoes thermal degradation at a temperature not lower than 200° C., carbonized at a temperature not lower than 350° C., and ignited at a temperature not lower than 420° C. This makes easy to remove the neodymium magnets 22. The acrylic adhesive may be HARDLOCK C-323-03 manufactured by the Denki Kagaku Kogyo Kabushiki Kaisha, having a thermal tensile shear strength as shown in FIG. 5, for example.

The pair of plate yokes 12a, 12b are supported to face each other at a predetermined distance and magnetically connected, by four column yokes 24 each having a circular cross section. With the above arrangement, the magnetic field generator 10 provides a uniform magnetic field in a space between the pair of pole pieces 16a, 16b. It should be noted here that the plate yokes 12a, 12b and the column yokes 24 are fixed and connected with each other by screws 26.

For example, the magnetic field generator 10 is 220 cm long, 120 cm wide, and 170 cm high. The distance between the pole pieces 16a, 16b is 40 cm~50cm. By placing the rectangular parallelepiped neodymium magnets 22 shown in FIG. 3 in two or three layers on each of the plate yokes 12a, 12b, a uniform spherical magnetic field space having a diameter of 30 cm~40 cm is formed between the pole pieces 16a, 16b. Magnetic intensity of the magnetic field space is 0.2 T~0.3 T.

Now, steps for dismantling the magnetic field generator 10 of the above constitution and recycling the neodymium magnets 22 will be described hereinafter.

Figure 6:
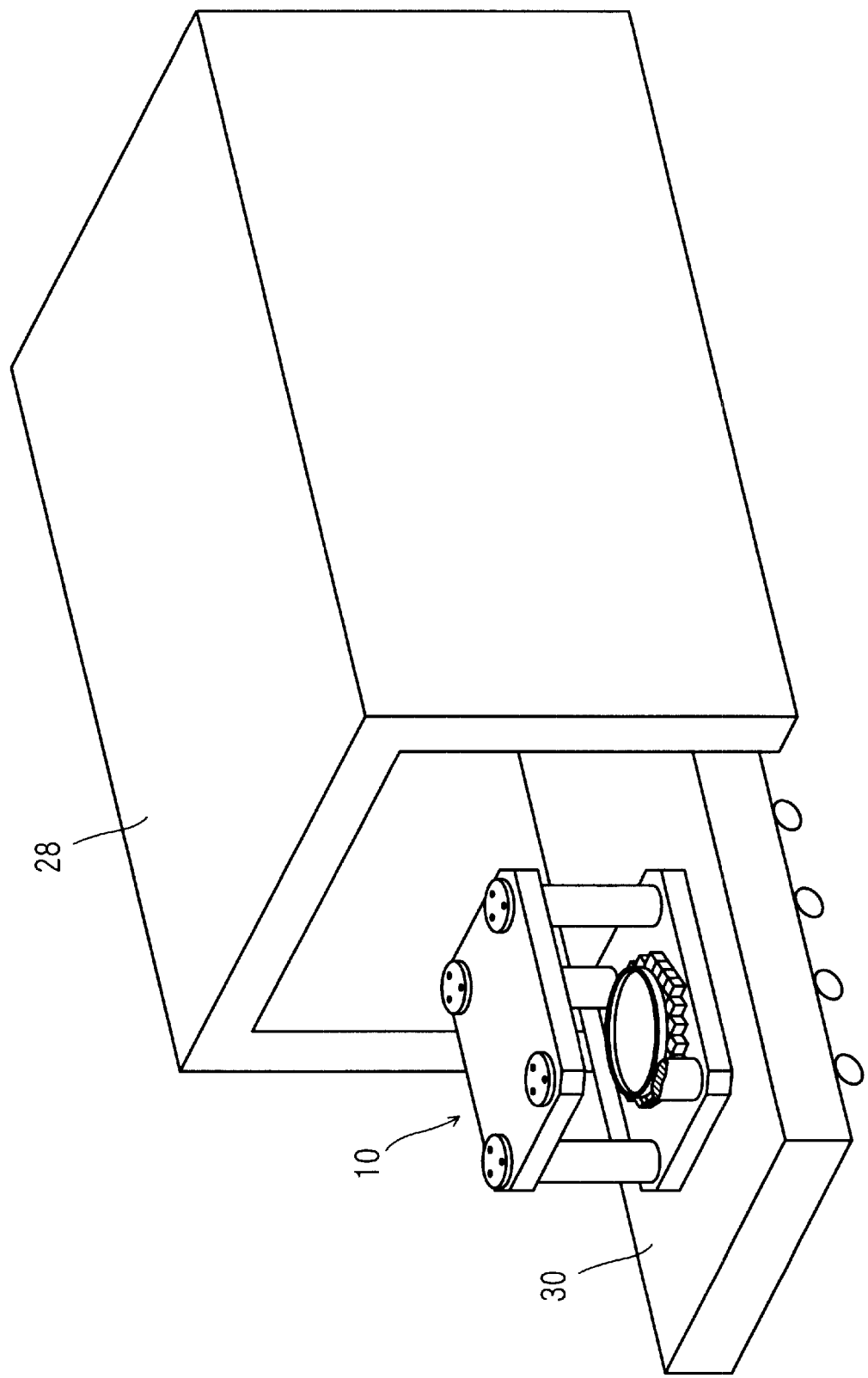
FIG. 6 is an illustration showing a heating furnace and a truck.

First, the MRI apparatus collected from a hospital for example is brought in a factory having a heating furnace 28 as shown in FIG. 6.

Next, thermal insulation materials, wiring and other electric wiring components, namely non-metal members, are removed so that there is only the magnetic field generator 10. Then, the magnetic field generator 10 is placed on a truck 30 as shown in FIG. 6, and brought into the heating furnace 28. The heating furnace 28 has to be as large as to accommodate the entire magnetic field generator 10 as assembled state. For example, if the magnetic field generator 10 has approximate dimensions of; length×width×height=1.9 m×1.1 m×1.5 m, the heating furnace 28 preferably has approximate entrance size of 2 m×2 m, with depth of about 5 m. The heating furnace 28 can be an electric furnace or a heavy-oil furnace, with the electric furnace being easier in temperature control.

Then, heating operation is performed in accordance with a heat pattern, as will be described later. After the heating operation is over, the magnetic field generator 10 is allowed to cool naturally. Thereafter, the bolts 18a, 18b of the magnetic field generator 10 are loosened, and the neodymium magnets 22 are removed and collected. Alternatively, the plate yokes 12a, 12b may be separated from the column yokes 24 before removing the neodymium magnets 22. Outer surfaces of the collected neodymium magnets 22 are polished. The neodymium magnets 22 are given aging (heat) treatment in a tempering furnace (not illustrated) as necessary, at a temperature of 450° C.~600° C., for not less than three hours for example, to recover the magnetic characteristic. The neodymium magnets 22 are then checked for dimensions and its magnetic characteristic, and reused.

Here, the heating operation is described in detail.

First, a method of heating operation in which the neodymium magnets 22 are demagnetized and the adhesive is ground off, will be described. The heating furnace 28 suitably used in this method is an electric furnace.

In this method, the heating is performed at a temperature, at which the neodymium magnets 22 are demagnetized to an extent not deteriorated in magnetic characteristic, and at which the adhesive is not carbonized. The adhesive is degraded by the heat and becomes brittle but not to an extent that the neodymium magnets 22 can be readily removed, so the adhesive must be ground off.

Specifically, a temperature is increased to 200° C.~350° C., and more preferably to 300° C. as shown by curve C in FIG. 7, and then the temperature is maintained for 5 hours. As understood from FIG. 4, this operation reduces the magnetism of the neodymium magnets 22 to not higher than 0.07 T. After the natural cooling, the plate yokes 12a, 12b are removed from the column yokes 24, and then, the pole pieces 16a, 16b are removed from the plate yokes 12a, 12b respectively, the adhesive is ground off and the neodymium magnets 22 are taken off. The adhesive can be machine-ground by a surface grinder for example.

According to the above method, the neodymium magnets 22 can be taken out safely only by physically removing the degraded adhesive, and the magnetic field generator 10 can be dismantled safely. Further, since the surfaces of the neodymium magnets 22 are not deteriorated, the neodymium magnets 22 can be reused easily by only cleaning the surfaces of the neodymium magnets 22 and then re-magnetizing the neodymium magnets 22.

Further, since the heating is made at a temperature not higher than 400° C., there is no need for performing the aging (heat) treatment to the neodymium magnets 22 after the heating operation.

Still further, since the heating furnace 28 can be used for heating the magnetic field generator 10, cost of dismantling can be lower than in the related art.

It should be noted that if the adhesive is soluble to a solvent even after the thermal degradation, the adhesive may be solved in a drum filled with the solvent. The solvent available for this operation may be ethyl acetate, methyl ethyl ketone, acetone and so on, but because of low penetrability of these solvents, the neodymium magnets 22 must be soaked for about a week. On the other hand, if a solvent having a high penetrability such as methylene chloride, ethylene chloride and so on is used, the neodymium magnets 22 can be removed in about 24 hours, but a large-scale facility such as a ventilation system is necessary in order to deal with intense vaporization of the solvent.

Next, a method of heating operation in which the adhesive is carbonized will be described. The heating furnace 28 suitably used in this method is a heavy-oil furnace. The heavy-oil furnace requires lower cost for the heating.

In this method, the magnetic field generator 10 is heated to a temperature above the Curie temperature (340° C.), and the adhesive is carbonized, for making possible to dismantle the magnetic field generator 10.

First, the entire magnetic field generator 10 is placed in the heating furnace 28, and the temperature is increased to 550° C. spending four hours as shown by curve D in FIG. 7. Thereafter, the temperature is maintained for 5 hours, the natural cooling is performed and then the magnetic field generator 10 is taken out of the furnace. After the natural cooling, the plate yokes 12a, 12b are removed from the column yokes 24, and then, the pole pieces 16a, 16b are removed from the plate yokes 12a, 12b respectively, and the neodymium magnets 22 are removed. Carbon sticks on surfaces of the removed neodymium magnets 22. Further, the surfaces of the neodymium magnets 22 are carbonized and oxidized, so the neodymium magnets 22 as removed are not easily re-bonded. Therefore, the surfaces of the removed neodymium magnets 22 are polished by a depth of about 0.1 mm~0.5 mm for removal of the carbonized and oxidized portions. After the polishing, re-aging is performed at a temperature of 500° C. for an hour so as to allow the neodymium magnets 22 to re-attain the magnetic characteristic. It should be noted here that the heating temperature must not be higher than 1000° C., because too high a temperature in the heating furnace 28 promotes grain growth of a tetragonal crystals of Nd2Fe14B, deteriorating the coercive force of the neodymium magnets 22.

According to the above method, adhesive is carbonated to lose adhering strength, and the neodymium magnets 22 lose the magnetism almost completely, and therefore the removal and handling of the neodymium magnets 22 are easily, and the magnetic field generator 10 can be dismantled safely.

Further, by polishing the surfaces of the collected neodymium magnets 22, the adhesion necessary for re-bonding the neodymium magnets 22 can be recovered. Further, by re-aging the neodymium magnets 22, the characteristic of the neodymium magnets 22 can be reliably reestablished.

By dismantling and recycling the used magnetic field generator 10 having a strong magnetic field, resources can be used effectively. Further, danger caused by leaving the magnetic field generator 10 can be avoided, and safety is assured.

The as-magnetized neodymium magnets 22 are very dangerous. However, by heating the column yokes 24 at least as connected to the plate yoke 12a or 12b, or as integrated in the magnetic field generator 10 as shown in FIG. 1, in the heating furnace 28, the dismantling operation can be performed more safely. Needless to say, in the dismantling, the plate yoke as connected with the permanent magnet may be heated in the heating furnace 28 in a state disconnected from the column yokes 24.

The present invention being thus far described and illustrated in detail, it is obvious that these description and drawings only represent an example of the present invention, and should not be interpreted as limiting the invention. The spirit and scope of the present invention is only limited by words used in the accompanied claims.

What is claimed is:

1. A method for dismantling a magnetic field generator comprising the steps of:

providing a plate yoke, and a permanent magnet provided on the plate yoke and including a plurality of neodymium magnets bonded together by an adhesive for the magnetic field generator;

heating the magnetic field generator at a temperature of 200° C.~1000° C.; and thereafter dismantling the magnetic field generator.

2. The method for dismantling the magnetic field generator according to claim 1, further comprising the step of providing a column yoke connected to the plate yoke for the magnetic field generator.

3. The method for dismantling the magnetic field generator according to claim 1, wherein the heating temperature of the magnetic field generator is 200° C.~400° C.

4. The method for dismantling the magnetic field generator according to claim 1, wherein the heating temperature of the magnetic field generator is 200° C.~350° C., at least one of the neodymium magnets being removed by first demagnetizing the neodymium magnet and then removing the adhesive.

5. The method for dismantling the magnetic field generator according to claim 1, wherein the heating temperature of the magnetic field generator is 350° C.~1000° C., at least one of the neodymium magnets being removed by carbonizing the adhesive.

6. The method for dismantling the magnetic field generator according to claim 1, wherein the adhesive is an acrylic adhesive.

7. The method for dismantling the magnetic field generator according to claim 1, wherein the neodymium magnets are three-element neodymium magnets having a R—Fe—B composition.

8. The method for dismantling the magnetic field generator according to claim 1, wherein magnetic poles of the neodymium magnets are oriented in the same direction.

* * * * *